United States Patent
Hsiao et al.

(10) Patent No.: US 12,216,142 B2
(45) Date of Patent: Feb. 4, 2025

(54) CURRENT SENSING RESISTORS AND METHOD OF MANUFACTURING THE SAME

(71) Applicant: YAGEO CORPORATION, Kaohsiung (TW)

(72) Inventors: Shen-Li Hsiao, Kaohsiung (TW); Hwan-Wen Lee, Kaohsiung (TW)

(73) Assignee: YAGEO CORPORATION, Kaohsiung (TW)

( * ) Notice: Subject to any disclaimer, the term of this patent is extended or adjusted under 35 U.S.C. 154(b) by 352 days.

(21) Appl. No.: 17/811,874

(22) Filed: Jul. 11, 2022

(65) Prior Publication Data

US 2023/0280379 A1  Sep. 7, 2023

(30) Foreign Application Priority Data

Mar. 1, 2022  (CN) .......................... 202210193229.6

(51) Int. Cl.
*G01R 19/00* (2006.01)
*H01C 17/00* (2006.01)

(52) U.S. Cl.
CPC ......... *G01R 19/0092* (2013.01); *H01C 17/00* (2013.01)

(58) Field of Classification Search
CPC .............................. H01C 17/00; G01R 19/0092
See application file for complete search history.

(56) References Cited

U.S. PATENT DOCUMENTS

| | | | |
|---|---|---|---|
| 9,230,719 B2* | 1/2016 | Feichtinger | H01C 7/008 |
| 2009/0272169 A1* | 11/2009 | Pan | H01C 17/065 |
| | | | 29/610.1 |
| 2013/0048602 A1* | 2/2013 | Wei | H01L 21/4807 |
| | | | 216/41 |
| 2013/0120104 A1 | 5/2013 | Li et al. | |
| 2013/0222106 A1* | 8/2013 | Saito | H01C 7/041 |
| | | | 338/22 R |

FOREIGN PATENT DOCUMENTS

| | | | | |
|---|---|---|---|---|
| JP | 2004119692 | * | 4/2004 | H01B 1/22 |
| TW | 201635316 A | | 10/2016 | |
| TW | 202029228 A | | 8/2020 | |

OTHER PUBLICATIONS

JP-2004119692 machine translation (Year: 2004).*

* cited by examiner

*Primary Examiner* — Kyung S Lee
(74) *Attorney, Agent, or Firm* — CKC & Partners Co., LLC

(57) ABSTRACT

Current sensing resistors and a method of manufacturing the same are disclosed in the present invention. A composite material is firstly provided in the method. Then, a first portion of an alloy substrate of the composite material is removed along a first direction to form a plurality of first trenches. Next, a second portion of the alloy substrate of the composite material is removed along a second direction to form a plurality of second trenches, and a third portion of the alloy substrate of the composite material is further removed along the first direction to form the current sensing resistors. The current sensing resistors with small dimensions and an extremely low temperature coefficient of resistance can be produced rapidly by the method of the present invention.

14 Claims, 6 Drawing Sheets

CURRENT SENSING RESISTORS AND METHOD OF MANUFACTURING THE SAME

RELATED APPLICATIONS

This application claims priority to China Application Serial Number 202210193229.6, filed Mar. 1, 2022, which is herein incorporated by reference.

BACKGROUND

Field of Invention

The present invention relates to current sensing resistors and a method of manufacturing the same. More particularly, the current sensing resistors with small dimensions and extremely low temperature coefficient of resistance and the method of manufacturing the same are provided.

Description of Related Art

A conventional process of manufacturing current sensing resistors includes multiple lamination processes, a dry-film lamination process under pressure, a wet-film printing process, a photolithography process, and a film removal process. The whole process is complicated and time-consuming. As dimensions of electronic components are decreased, the current sensing resistors are developed toward miniaturization and requested to maintain the excellent property of extremely low temperature of coefficient of large size resistors. However, it is difficult to manufacture small-size current sensing resistors by the complicated processes, and these processes cannot meet the requirements. In addition, while the dimensions of the products are decreased, several quality defects of poor solderability, resistance shift, or burning of resistors are occurred in the electrodes due to under development or over development. Resistance shift of the resistors is induced due to the interfacial problem of the electrodes while the resistors pass through the reflow oven. Burning of resistors occurs due to poor current resistance when a strong current is applied to the resistors for a long time.

Therefore, there is an urgent need to provide current sensing resistors and a method of manufacturing the same to improve the defects of the conventional manufacturing method of current sensing resistors.

SUMMARY

An aspect of the present invention is to provide a method of manufacturing current sensing resistors. Small size resistors can be rapidly and effectively formed by the method to meet the requirements of the applications.

Another aspect of the present invention is to provide current sensing resistors with small dimensions and an extremely low temperature coefficient of resistance which are manufactured by the aforementioned method.

According to the aforementioned aspect of the present invention, a method of manufacturing the current sensing resistors is provided. The method includes: an operation of providing a composite material that includes an insulating layer and an alloy substrate disposed on the insulating layer, and the alloy substrate has the temperature coefficient of resistance lower than 50 ppm/° C.; an operation of removing a first portion of the alloy substrate of the composite material along a first direction to form a plurality of first trenches on an upper surface of the alloy substrate; an operation of removing a second portion of the alloy substrate of the composite material along a second direction to form a plurality of second trenches, and the second trenches expose the insulating layer, and the second direction is not parallel to the first direction; and an operation of removing a third portion of the alloy substrate along the first direction to form a plurality of third trenches and a plurality of resistive elements after forming the second trenches, and the third trenches expose the insulating layer, each of the third trenches is disposed between adjacent two of the first trenches, and the resistive elements are arranged in an array on the insulating layer.

According to some embodiments of the present invention, the aforementioned alloy substrate has a thickness smaller than 0.5 mm.

According to some embodiments of the present invention, the aforementioned alloy substrate comprises CuMnSn or CuMnNi.

According to some embodiments of the present invention, the method further comprises removing a portion of a bottom surface of each of the first trenches after forming the resistive elements.

According to the embodiments of the present invention, an aspect ratio of each of the aforementioned first trenches is 0.1 to 0.35, respectively.

According to the embodiments of the present invention, the aforementioned first direction is perpendicular to the second direction.

According to the embodiments of the present invention, the aforementioned first direction is not perpendicular to the second direction.

According to the embodiments of the present invention, the aforementioned operation of removing the first, the second, and the third portion of the alloy substrate includes dicing or scraping the surface of the alloy substrate.

According to the embodiments of the present invention, the aforementioned insulating layer is bonded with the alloy layer by binders.

According to the embodiments of the present invention, an insulating material is coated on the alloy substrate to form the insulating layer.

According to the embodiments of the present invention, an alloy material is deposited on the insulating layer to form the alloy substrate.

According to the embodiments of the present invention, the method further comprises filling a protective material into each of the first trenches to form a protective layer after forming the third trenches.

According to the embodiments of the present invention, the method further comprises separating each of the resistive elements to obtain the current sensing resistors after forming the protective layer.

According to some embodiments of the present invention, the method further comprises forming an alloy layer on each of the current sensing resistors.

According to another aspect of the present invention, a current sensing resistor is provided. The current sensing resistor is manufactured by the aforementioned manufacturing method, and the long side of the current sensing resistor is smaller than 1.8 mm, and the current sensing resistor has the temperature coefficient of resistance lower than 50 ppm/° C.

According to the aforementioned aspect of the present invention, a method of manufacturing the current sensing resistors is provided. The method includes: forming an insulating layer on an alloy substrate, wherein a temperature coefficient of resistance of the alloy substrate is lower than 50 ppm/° C.; patterning the alloy substrate to form a plurality of trenches; and filling protective materials into a portion of the plurality of trenches to form a plurality of resistive elements.

According to some embodiments of the present invention, the aforementioned protective materials comprise a polymer material.

Application of the current sensing resistors and method of manufacturing the same in the present invention is removing the same material of the alloy substrate along the first direction and the second direction to rapidly and effectively form small size current sensing resistors with extremely low temperature coefficient of resistance. Moreover, since the same alloy substrate of the current sensing resistors in the present invention is processed, there is no need to use photolithography technique or combine the electrodes and the resistors by soldering. Therefore, the manufacturing method of the current sensing resistors in the present invention can prevent drawbacks such as under-development or over-development in the photolithography technique, poor solderability due to the incomplete pattern of the electrodes, and quality problems of resistance shift after the reflow process. Accordingly, the current sensing resistors of the present invention have excellent properties such as low temperature coefficient of resistance, no poor solderability, complete pattern of electrodes, etc.

BRIEF DESCRIPTION OF THE DRAWINGS

Embodiments and advantages of the present invention can be fully understood from the following detailed description when read with the accompanying figures. It is noted that, various features are not drawn to scale, and these features are only for illustrative purposes. Related figures are described as follows.

DETAILED DESCRIPTION

The following describes manufacturing and utilizing embodiments of the present invention in detail. However, it can be understood that various applicable inventive concepts are provided in embodiments that can be applied in a variety of specific contents. Specific embodiments described are only for descriptive purposes, and are not intended to be limiting.

Figure 1:
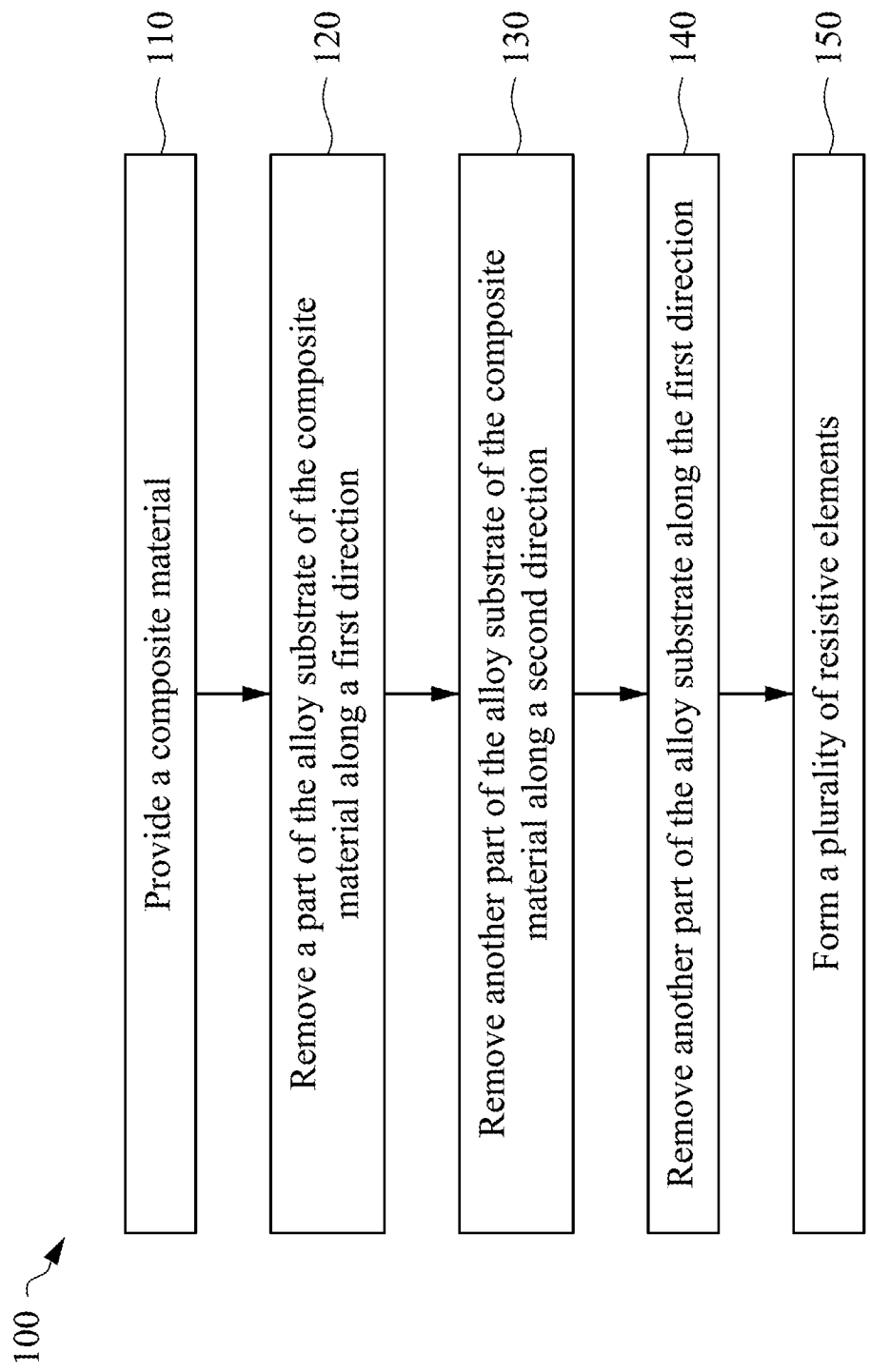
FIG. 1 illustrates a flow chart of the method of manufacturing the current sensing resistors according to some embodiments of the present invention.
Figure 2A:
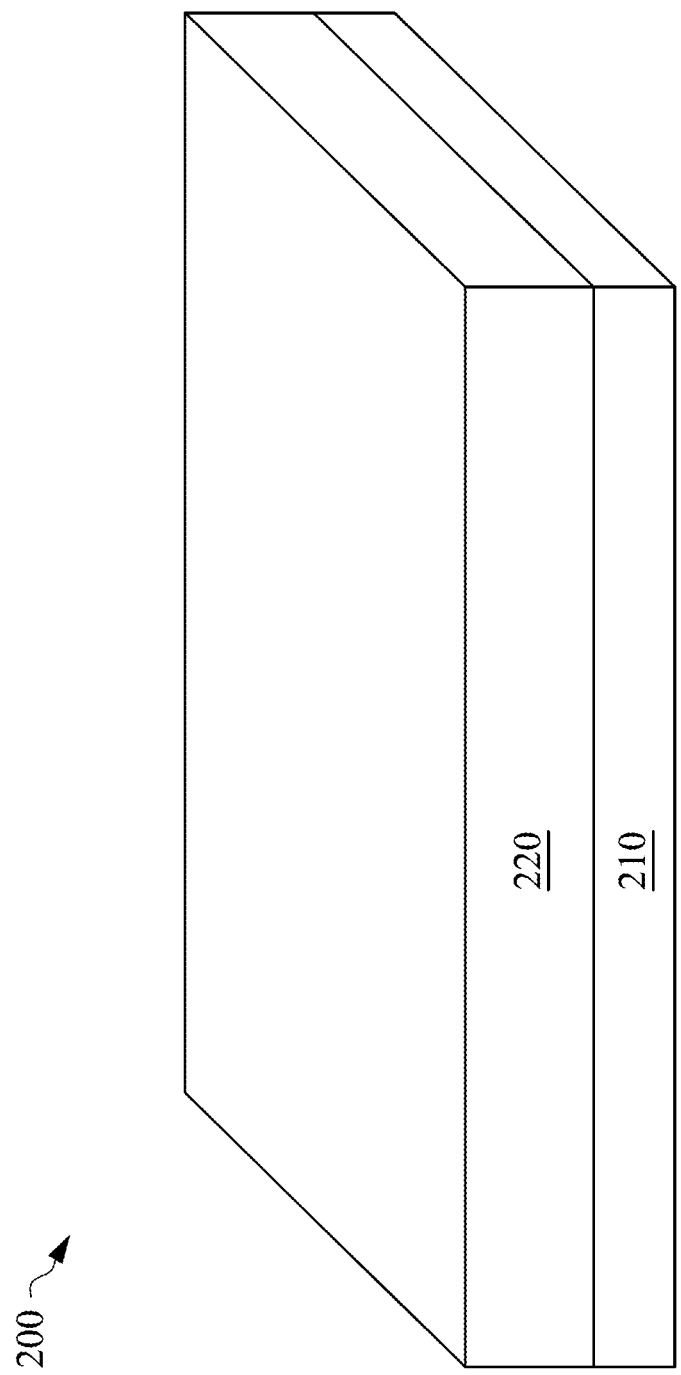
FIG. 2A to FIG. 2D illustrates a three dimensional view of the current sensing resistors formed in each stage of FIG. 1 according to the present invention, respectively.
Figure 2B:
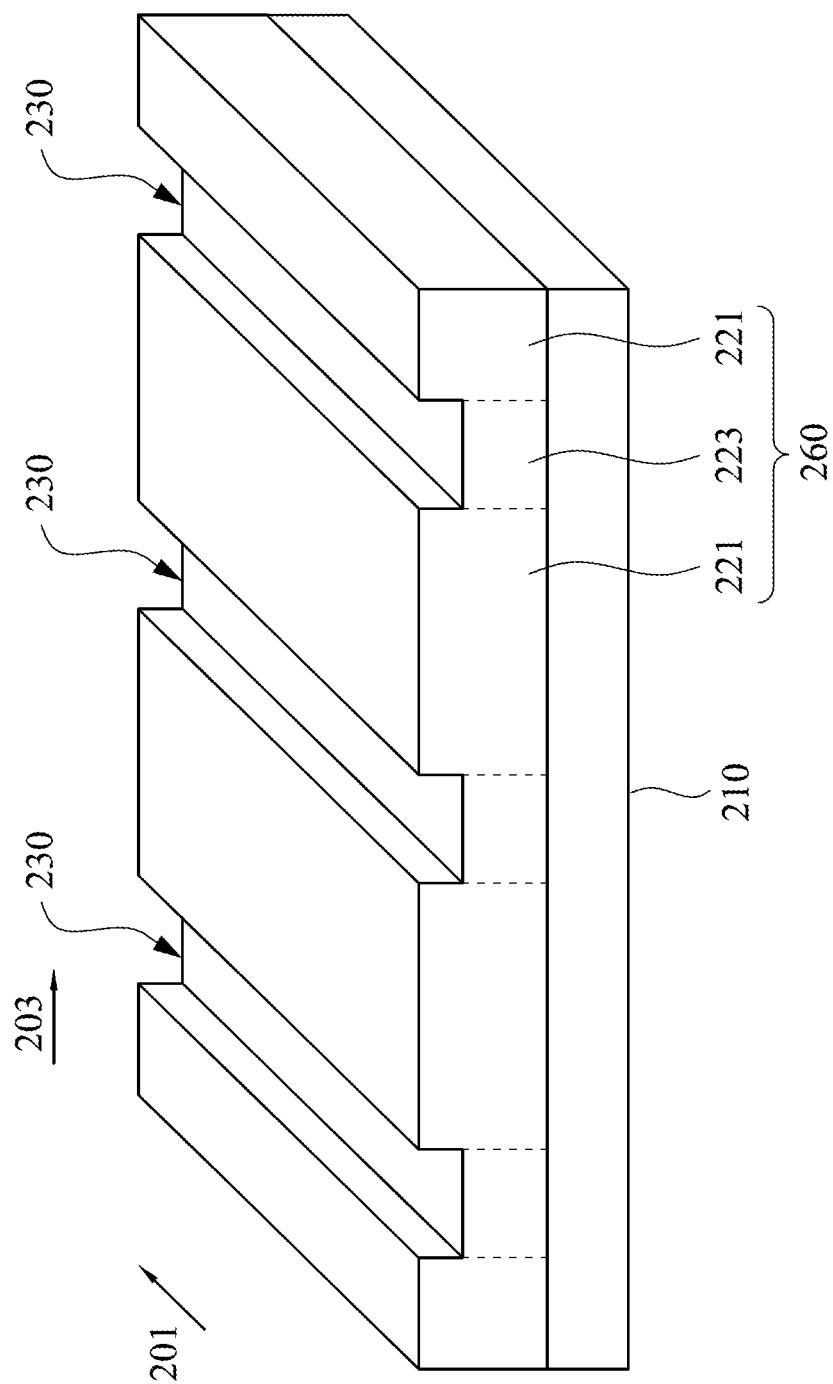
Figure 2C:
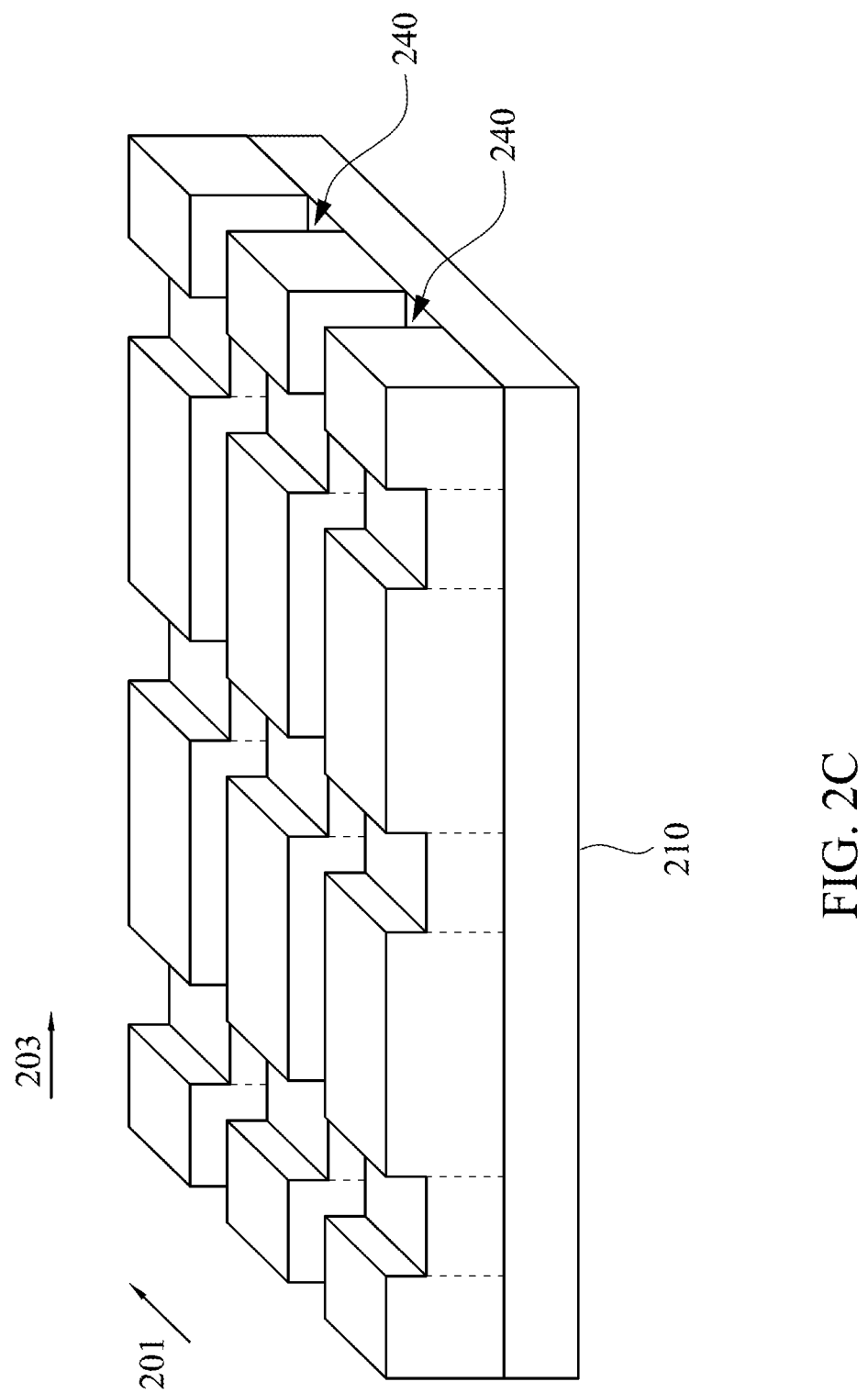
Figure 2D:
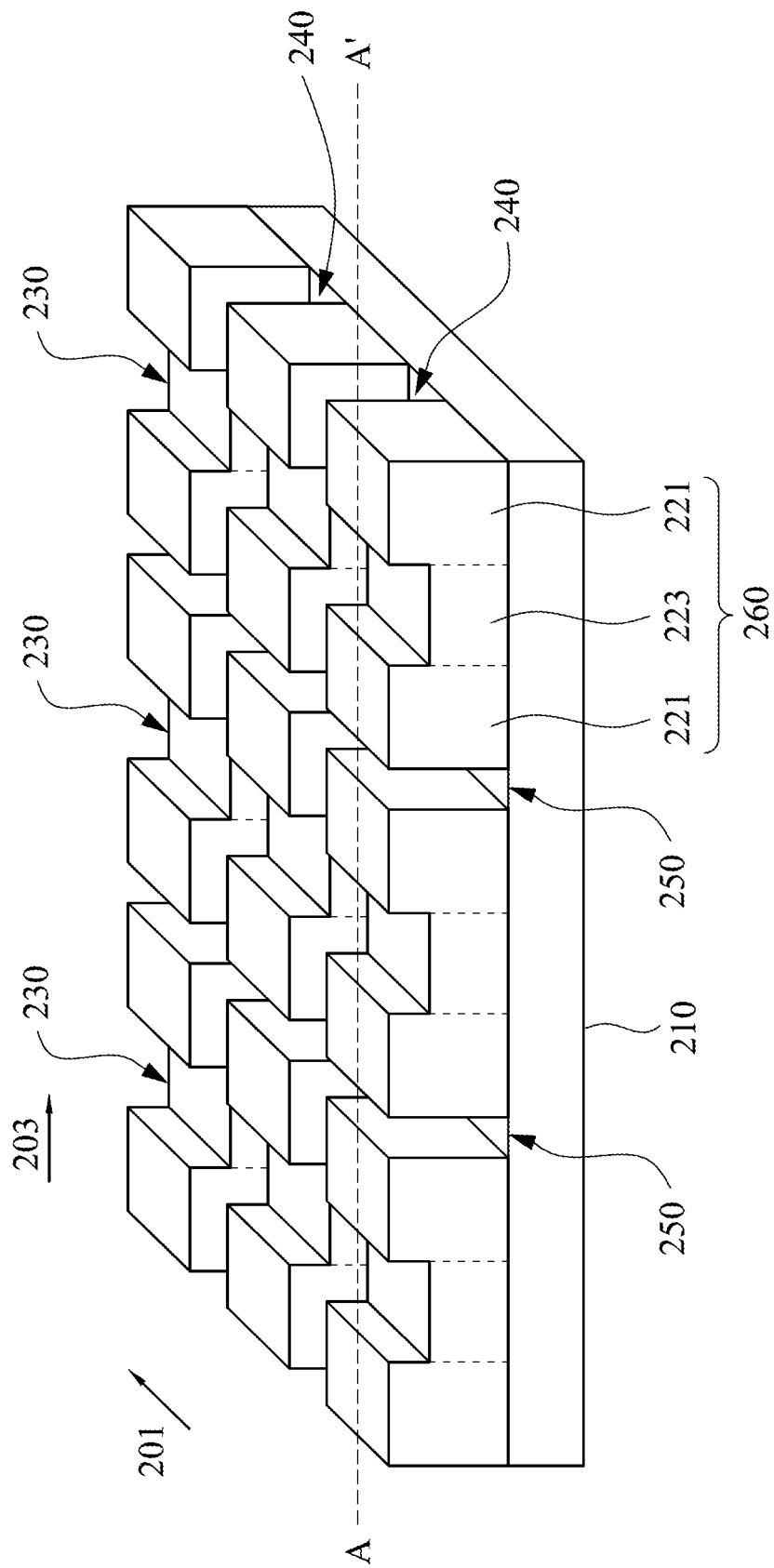

Referring to FIG. 1 together with FIG. 2A to FIG. 2D. FIG. 1 illustrates a flowchart of the method of manufacturing the current sensing resistors in accordance with some embodiments of the present invention. FIG. 2A to FIG. 2D respectively illustrates three dimensional views of the current sensing resistors manufactured in each stage according to FIG. 1. In the manufacturing method 100, a composite material 200 is firstly provided as shown in operation 110. The composite material 200 includes an insulating layer 210 and an alloy substrate 220 disposed on the insulating layer 210. In some embodiments, an insulating material (e.g. $Al_2O_3$ slurry) or any other suitable insulating material is coated on a bottom surface of the alloy substrate 220 to form the insulating layer 210 by a printing process or similar coating processes. In other embodiments, an alloy material is deposited on the top surface of the insulating layer 210 to form the alloy substrate 220 by a coating process or similar processes. In other embodiments, the insulating layer 210 is bonded with the alloy substrate 220 by binders or any other suitable fastening methods, thereby ensuring that the alloy substrate 220 is tightly adhered on the insulating layer 210 to facilitate subsequent manufacturing processes.

There are no specific limitations in the insulating layer 210, but the insulating layer 210 has electrical insulating properties and can support the alloy substrate 220. The alloy substrate 220 has the temperature coefficient of resistance (TCR) lower than 50 ppm/° C. When the dimensions of resistor components are microminiaturized, it is difficult to control the dimensions with the conventional photolithographic processes and the conventional welding techniques, and the welding techniques can not satisfy the microminiaturization, such that the temperature coefficient of resistance is higher than 50 ppm/° C. Therefore, the resistor components cannot work stably in a wide range of working temperature. In some embodiments, a thickness of the alloy substrate 220 is smaller than 0.5 mm to meet the requirements of small size applications. In some embodiments, the alloy substrate 220 includes but is not limited to CuMnSn, CuMnNi, other suitable alloy materials or combinations thereof.

As shown in operation 120, a first portion of the alloy substrate 220 is removed along a first direction to form first trenches 230 on the upper surface of the alloy substrate 220, and therefore the alloy substrate 220 is separated into a plurality of electrode regions 221 and a plurality of resistive regions 223. Each of the resistive regions 223 is positioned between two adjacent electrode regions 221, and each of the first trenches 230 is positioned above the corresponding resistive region 223. The methods of removing alloy substrate 220 include but are not limited to dicing, scraping, any other suitable methods or combinations thereof. The numbers and shapes of the first trenches 230 on the alloy substrate 220 can be adjusted according to the actual requirements such as area of the alloy substrate 220, width of dicing, specifications (e.g. resistance value) of the current sensing resistors or the like. In some embodiments, the width of the first trenches 230 can be 0.15 mm to 0.40 mm. In some embodiments, an aspect ratio of the first trenches can be 0.1 to 1.0. When the aspect ratio of the first trenches is in the aforementioned range, a wider or a squarer opening facilitates subsequent manufacturing processes to the bottom portion of the first trenches 230. In some embodiments, the depth of the first trenches 230 is smaller than half of the thickness of the alloy substrate 220. When the depth of the first trenches 230 meets the aforementioned conditions, a thickness of the resistive regions 223 at least is half of the thickness of the alloy substrate 220, and therefore it can provide proper mechanical strength and facilitate to control the resistance value of the resistive elements that is manufactured mentioned below within a certain range (e.g. smaller than 10 mohm).

As shown in operation 130, a second portion of the alloy substrate 220 is removed along a second direction 203 to form a plurality of second trenches 240 on the upper surface of the alloy substrate 220, and therefore the insulating layer 210 is exposed by the second trenches 240. The method for removing the alloy substrate 220 of operation 130 and the removing method of operation 120 can be the same or different. The numbers and shapes of the second trenches 240 on the alloy substrate 220 can be adjusted according to the actual requirements such as the area, the width of dicing or specifications of the current sensing resistors (e.g. size) of the alloy substrate 220, etc. In some embodiments, since the insulating layer 210 and the alloy substrate 220 are made of different materials that have different mechanical properties (e.g. hardness), the upper surface of the insulating layer 210 is exposed by the second trenches 240 in order to ensure that the bonding location of the alloy substrate 220 and the insulating layer 210 has good surface flatness and the surface topography of the second trenches 240 can be maintained as required. In some embodiments, the operation 130 is performed to respectively remove a portion of the alloy substrate 220 and a portion of the insulating layer 210 along the second direction 203 to reduce the thickness of the insulating layer 210, and therefore it is beneficial to much easily separate resistive elements in subsequent operation 150. The second direction 203 cannot be parallel to the first direction 201. According to the specification of the required current sensing resistors, an angle between the second direction 203 and the first direction 201 is larger than 0 degree and smaller than 180 degree, and preferably is 90 degree.

Figure 3A:
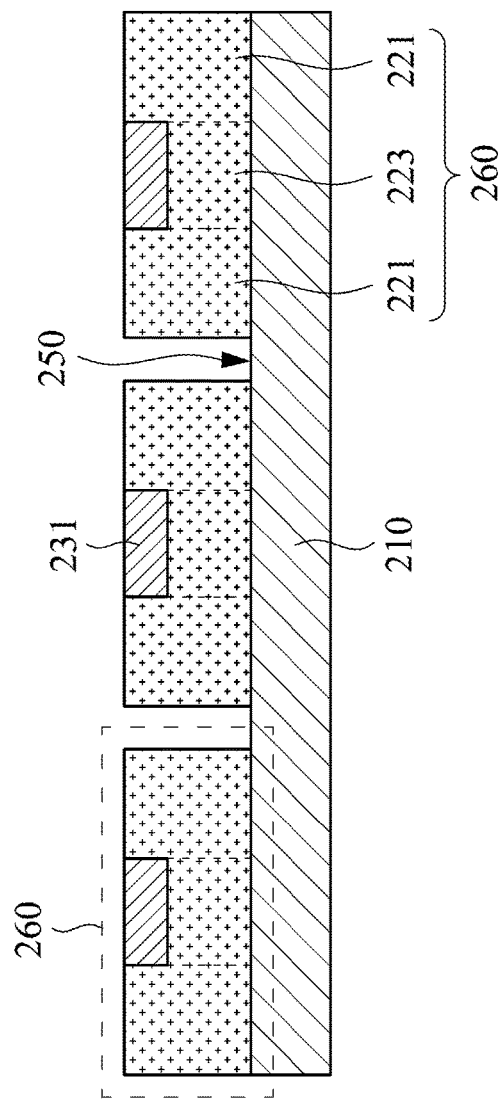
FIG. 3A illustrates a cross-sectional view of the current sensing resistors along line A-A' in FIG. 2D.

As shown in operation 140 and operation 150, a third portion of the alloy substrate 220 is removed along the first direction to form a plurality of third trenches 250 on the upper surface of the alloy substrate 220. Therefore, the insulating layer 210 is exposed by the third trenches 250, and the alloy substrate 220 is divided into a plurality of independent resistive elements (as shown in FIG. 3A). Each of the resistive elements 260 includes two electrode regions 221 and one resistive region 223, and each of the second trenches 240 or each of the third trenches 250 is positioned between each of the adjacent resistive elements 260. In other words, each of the resistive elements 260 is arranged in an array on the insulating layer independently. The method for removing the alloy substrate 220 of operation 140 and the removing method of operation 120 can be the same or different. The numbers and shapes of the third trenches 250 on the alloy substrate 220 can be adjusted according to the actual requirements such as area, the width of dicing or specifications of the current sensing resistors (e.g. size) of the alloy substrate 220, and the like. Similar to the insulating layer 210 in the operation 130, the top surface of the insulating layer 210 is exposed by the third trenches 250, or the bottom surface of the third trenches is lower than the top surface of the insulating layer 210, in some embodiments. It is understood that although the top surface of the insulating layer 210 is exposed by the second trenches 240 and the third trenches 250 illustrated in the figures of the present invention (e.g. FIG. 2C, FIG. 2D and FIG. 3A, FIG. 3B described below), the present invention is not limited thereto. In other examples, the bottom surface of the second trenches 240 and/or the third trenches 250 can be lower than the top surface of the insulating layer 210.

Referring to FIG. 1 together with FIG. 3A. FIG. 3A is a schematic cross-sectional view of the current sensing resistors taken along line A-A' in FIG. 2D. After operation 150 (i.e. forming resistive elements 260), the manufacturing method 100 of the present invention further includes filling protective materials into the first trenches 230 of the resistive elements 260 to form the protective layer 231 on the resistive regions 223. The resistive regions 223 is completely covered by the protective layer 231, and protective materials include but are not limited to solder resist ink (e.g. epoxy resin) and/or any other suitable protective materials. The thickness of the protective layer 231 can be adjusted according the actual requirements. It is noted that, the top surface of the protective layer 231 is not higher than the top surface of the electrode regions 221. In other embodiments, the top surface of the protective layer 231 can be higher than the top surface of the electrode regions 221, but the top surface of the electrode regions 221 is not completely covered by the protective layer 231 to ensure that electrode regions 221 can be used as the electrodes of the current sensing resistors.

Figure 3B:
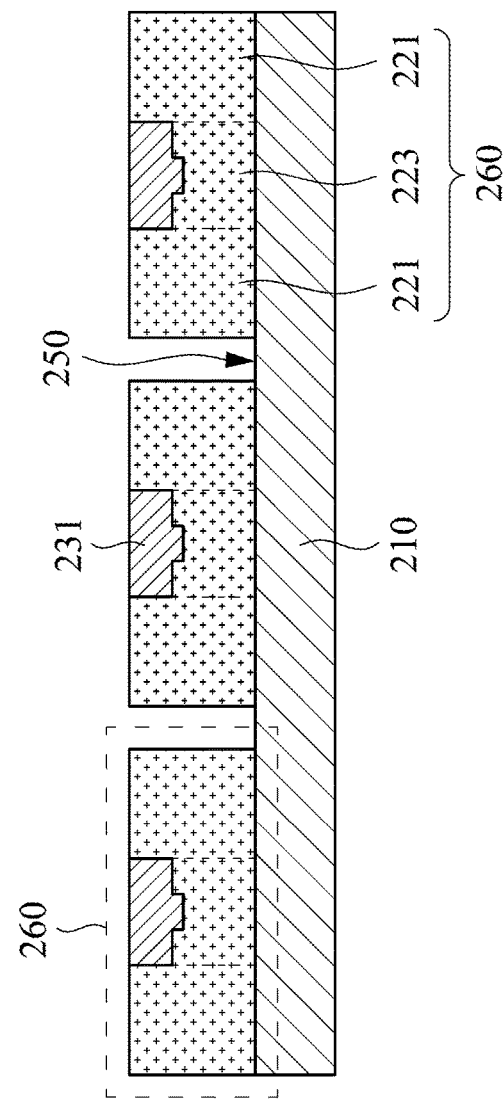
FIG. 3B illustrates a cross-sectional view of the current sensing resistors according to some embodiments of the present invention.

Referring to FIG. 1 together with FIG. 3B. FIG. 3B illustrates schematic cross-sectional view of the current sensing resistors according to the embodiments of the present invention. In some embodiments, after operation 140, the manufacturing method 100 of the present invention further includes performing a processing operation to the resistive regions 223 to remove portions of the resistive regions 223, thereby adjusting the resistance value of the manufactured current sensing resistors. The methods of removing portions of resistive regions 223 include but are not limited to dicing, drilling and/or other suitable methods. According to the desired resistance value of the current sensing resistors, the removed resistive regions 223 in FIG. 3B can be rectangular, bowed or any other suitable shapes. In some embodiments, each of the resistive elements 260 on the insulating layer 210 can be processed independently, such that the cross-sectional shape of the removed resistive regions 223 in each of the resistive elements 260 can be the same or different. In some embodiments, after processing, the manufacturing method 100 of the present invention can selectively comprise filling the protective materials into the resistive regions 223 in FIG. 3B to form the protective layer 231. The forming method and the materials of the protective layer 231 in FIG. 3B are the same as those of the protective layer 231 in FIG. 3A rather focusing or mentioning them in details.

Reference is made to FIG. 3A. In some embodiments, the manufacturing method 100 of the present invention further includes separating each of the resistive elements 260 to obtain the main part of the resistor of the current sensing resistors after forming protective layer 231. Separating methods include but are not limited to punching, dicing and/or any other suitable methods. After separating each of the resistive elements 260, the manufacturing method further includes forming an alloy layer on each of the resistive elements 260 to form the desired current sensing resistors. The alloy layer is formed by coating metallic materials on the electrode regions of the resistive elements 260. The metallic materials include Cu, Ni, Sn, any other suitable metal, and combinations thereof.

In some examples, for the alloy substrate 220 with a thickness of 0.075 mm to 0.30 mm, the first trenches 230 (the aspect ratio can be 0.1 to 0.35) with a width of 0.15 mm to 0.40 mm are formed therein by the aforementioned method, and therefore the current sensing resistors with the temperature coefficient of resistance lower than 50 ppm/° C. and small size (e.g. the long side is smaller than 1.8 mm) can be efficiently produced. The resistance of each of the current sensing resistors is smaller than 10 mohm. In some examples, the alloy substrate 220 with a thickness of 0.10 mm to 0.20 mm, the first trenches 230 (the aspect ratio can be 0.15 to 0.3) with the width of 0.15 mm to 0.30 mm are formed therein by the aforementioned method; and therefore current sensing resistors with the temperature coefficient of resistance lower than 50 ppm/° C. and small size (e.g. the long side is smaller than 1.2 mm) can be efficiently produced. The resistance of each of the current sensing resistors is smaller than 5 mohm. In some examples, the alloy substrate 220 with a thickness of 0.10 mm to 0.15 mm, the first trenches 230 (the aspect ratio can be 0.15 to 0.29) with the width of 0.15 mm to 0.25 mm are formed therein by the aforementioned method; and therefore current sensing resistors with the temperature coefficient of resistance lower than 50 ppm/° C. and small size (e.g. the long side is smaller than 0.7 mm) can be efficiently produced. The resistance of each of the current sensing resistors is smaller than 3 mohm.

In some applied examples, the small size (e.g. the long side is smaller than 1.8 mm) current sensing resistors with the temperature coefficient of resistance lower than 50 ppm/° C. can be effectively produced by the aforementioned method. Moreover, the current sensing resistors can be rapidly manufactured by the simple removing process in the manufacturing method of the present invention. Accordingly, conventional techniques of welding or photolithography are not applied in the manufacturing method of the present invention, such that the current sensing resistors can effectively prevent defects such as poor solderability and electrode deformation that can easily induced by the conventional techniques.

Although the present invention has been disclosed with the embodiments described above, the embodiments are not used to limit the present invention. It will be apparent to those skilled in the art that various modifications and variations can be made to the structure of the present invention without departing from the scope or spirit of the present invention. Therefore, the scope of protection in the present invention is determined by the scope of the following claims.

What is claimed is:

1. A method of manufacturing current sensing resistors, comprising:
    providing a composite material, wherein the composite material comprises an insulating layer and an alloy substrate disposed on the insulating layer, and a temperature coefficient of resistance of the alloy substrate is lower than 50 ppm/° C.;
    removing a first portion of the alloy substrate of the composite material along a first direction to form a plurality of first trenches on an upper surface of the alloy substrate;
    removing a second portion of the alloy substrate of the composite material along a second direction to form a plurality of second trenches, wherein the insulating layer is exposed by the plurality of second trenches, and the second direction is not parallel to the first direction; and
    removing a third portion of the alloy substrate along the first direction to form a plurality of third trenches and a plurality of resistive elements after forming the plurality of second trenches, wherein the insulating layer is exposed by the plurality of third trenches, each of the third trenches is disposed between adjacent two of the first trenches, and the plurality of resistive elements are arranged in an array on the insulating layer.

2. The method of claim 1, wherein the alloy substrate has a thickness smaller than 0.5 mm.

3. The method of claim 1, wherein the alloy substrate comprises CuMnSn or CuMnNi.

4. The method of claim 1, further comprising removing a portion of a bottom surface of each of the first trenches after forming the resistive elements.

5. The method of claim 1, wherein an aspect ratio of each of the first trenches is 0.1 to 0.35, respectively.

6. The method of claim 1, wherein the first direction is perpendicular to the second direction.

7. The method of claim 1, wherein removing the first, the second, and the third portion of the alloy substrate includes dicing or scraping the surface of the alloy substrate.

8. The method of claim 1, wherein the insulating layer is bonded with the alloy layer by binders.

9. The method of claim 1, wherein an insulating material is coated on the alloy substrate to form the insulating layer.

10. The method of claim 1, wherein an alloy material is deposited on the insulating layer to form the alloy substrate.

11. The method of claim 1, further comprising filling a protective material into each of the first trenches to form a protective layer after forming the plurality of third trenches.

12. The method of claim 11, further comprising separating each of the resistive elements to obtain the current sensing resistors after forming the protective layer.

13. The method of claim 12, further comprising forming an alloy layer on each of the current sensing resistors.

14. A current sensing resistor manufactured by the method of claim 1, wherein a long side of the current sensing resistor is smaller than 1.8 mm, and the current sensing resistor has a temperature coefficient of resistance lower than 50 ppm/° C.

* * * * *